(12) United States Patent
Numata et al.

(10) Patent No.: US 7,235,425 B2
(45) Date of Patent: Jun. 26, 2007

(54) SEMICONDUCTOR DEVICE AND FABRICATION METHOD FOR THE SAME

(75) Inventors: Hideo Numata, Kanagawa (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/062,664

(22) Filed: Feb. 23, 2005

(65) Prior Publication Data

US 2005/0184373 A1 Aug. 25, 2005

(30) Foreign Application Priority Data

Feb. 24, 2004 (JP) ............................ P2004-048266

(51) Int. Cl.
*H01L 21/00* (2006.01)
(52) U.S. Cl. ................ 438/108; 438/109; 257/E21.503
(58) Field of Classification Search ........ 438/106–127, 438/E21.503, E21.511; 257/678, 690, 700, 257/758, 777, 778, E21.503, E21.511
See application file for complete search history.

(56) References Cited

U.S. PATENT DOCUMENTS

| 6,238,515 B1 | 5/2001 | Tsujimoto et al. | |
|---|---|---|---|
| 6,710,455 B2 | 3/2004 | Goller et al. | |
| 2001/0013643 A1* | 8/2001 | Nakanishi et al. | 257/678 |
| 2003/0054162 A1 | 3/2003 | Watson | |
| 2004/0051168 A1* | 3/2004 | Arai et al. | 257/678 |
| 2004/0084760 A1 | 5/2004 | Liu et al. | |
| 2004/0126926 A1* | 7/2004 | Arai et al. | 438/107 |
| 2004/0222534 A1* | 11/2004 | Sawamoto et al. | 257/778 |

FOREIGN PATENT DOCUMENTS

| EP | 1195809 A2 * | 4/2002 |
|---|---|---|
| JP | 57-37839 | 3/1982 |
| JP | 5-335411 | 12/1993 |
| JP | 2002-118081 | 4/2002 |
| JP | 2002-141459 | 5/2002 |
| JP | 2002-261233 | 9/2002 |
| JP | 2003-007963 | 1/2003 |
| JP | 2003-100953 | 4/2003 |
| JP | 2003-147300 | 5/2003 |
| JP | 2003-303937 | 10/2003 |
| JP | 2004-071997 | 3/2004 |
| TW | 506623 | 10/2002 |
| TW | 540272 | 7/2003 |
| TW | 546795 | 8/2003 |

OTHER PUBLICATIONS

Final Office Action Prior to Rejection issued by the Taiwanese Patent Office on Jun. 27, 2006, for Taiwanese Patent Application No. 94105308, and English-language translation thereof.
Notice of Rejection issued by the Japanese Patent Office on Jan. 30, 2007, for Japanese Patent Application No. 2004-48266, and English-language translation thereof.

* cited by examiner

*Primary Examiner*—Brook Kebede
(74) *Attorney, Agent, or Firm*—Finnegan, Henderson, Farabow, Garrett & Dunner, L.L.P.

(57) ABSTRACT

A method for fabricating a semiconductor device includes mountain a first semiconductor chip on a wiring substrate, bonding a spacer having a first main surface and a second main surface opposing the first main surface such that the first main surface is in contact with the first semiconductor chip. The method further includes bonding a second semiconductor chip having a surface, onto the second main surface via a layer of a die bonding material selectively formed on a part of a third main surface.

2 Claims, 14 Drawing Sheets

SEMICONDUCTOR DEVICE AND FABRICATION METHOD FOR THE SAME

CROSS-REFERENCE TO RELATED APPLICATION AND INCORPORATION BY REFERENCE

This application claims benefit of priority based on Japanese Patent Applications filed previously by the applicant, namely, Japanese Patent Application Nos. 2004-048266 (filing date: Feb. 24, 2004), the contents of which are herein incorporated by reference.

BACKGROUND OF THE INVENTION

1. Field of the Invention

The present invention relates to a semiconductor device and a fabrication method for the same.

2. Description of the Related Art

In recent years, thinner semiconductor chips are desired for mounting in a card-shaped thin package and providing a small mounted area of multiple semiconductor chips. However, wafer cracks or underside chipping may occur when transferring or dicing individual semiconductor chips, which are obtained by dicing a thin wafer provided by grinding the side (underside) opposing a device formed wafer side.

Dicing before grinding (DBG) methodology has been proposed as a method of preventing, to the utmost, wafer cracks or underside chipping due to thinned semiconductor chips (see Japanese Patent Application Laid-open 2002-118081, Japanese Patent Application Laid-open 2003-147300).

A semiconductor device 110 fabricated through the DBG methodology is shown in FIG. 1A, and a semiconductor device 120 is shown in FIG. 1B. The semiconductor device 110 shown in FIG. 1A is made up of a wiring substrate 106, a first and a second semiconductor chip 101a and 101b, a spacer 113, die bonding sheets (material) 104, and wires 112a, 112b connected to the first and the second semiconductor chip 101a and 101b. The first semiconductor chip 101a mentioned above has the die bonding sheet 104 on a first main surface opposing the wiring substrate 106, and a semiconductor element is formed on a second main surface opposing the first main surface. Accordingly, the second semiconductor chip 101b mentioned above has the die bonding sheet 104 on a third main surface opposing the wiring substrate 106, and a semiconductor element is formed on a fourth main surface opposing the third main surface. The die bonding sheet 104 having the same width as the spacer 113, which is sandwiched between the first and the second semiconductor chip 101a and 101b, is bonded to the first main surface opposing the wiring substrate 106. The first semiconductor chip 101a is mounted on the wiring substrate 106 via the die bonding sheet 104 formed on the first main surface. The second semiconductor chip 101b is adhered so that the third main surface opposes the first semiconductor chip 101a and that the spacer 113 is sandwiched therebetween.

A earlier technology fabrication method for the semiconductor device 110 is explained forthwith while referencing the process drawings of FIG. 2A to 2G and FIG. 3A to 3F.

(i) To begin with, as shown in FIG. 2A, semiconductor chips 101, which are obtained by being divided into diced shapes through the DBG methodology, are mounted on a surface protection sheet 102 so that the device formation face (the first or the third main surface) opposes the surface protection sheet 102.

(ii) Next, the die bonding sheet 104 is mounted on the semiconductor chips 101 as shown in FIG. 2B, and protruding portions 104c of the die bonding sheet 104 are removed as shown in FIG. 2C.

(iii) After turning the die bonding sheet over as shown in FIG. 2D, the die bonding sheet 104 is bonded on a sheet 108 so that the sheet 108 opposes the die bonding sheet 104. Afterwards, by peeling off the surface protection sheet 102, the adhesion faces of the respective semiconductor chips 101 are changed to the side of the sheet 108, and are joined to the die bonding sheet 104.

(iv) The semiconductor chip 101 with the die bonding sheet 104 is irradiated with ultraviolet light using a earlier technology method as shown in FIG. 2E. Consequently, an ultraviolet irradiated portion of the die bonding material 104b is hardened to be integrated with the sheet 108. Meanwhile, the remaining portion of the die bonding sheet 104 that was not irradiated since it is behind the semiconductor chip 101 maintains viscosity that allows it to be peeled off.

(v) This allows only each semiconductor chip 101 with the die bonding sheet 104 to be picked up when picking up the semiconductor chip 101 in the direction of the arrow using a transfer collet (not shown in the drawing) as shown in FIG. 2F.

(vi) A semiconductor chip 101 is mounted as the first semiconductor chip 101a on the wiring substrate 106 via the die bonding sheet 104 as shown in FIG. 3A. A spacer 113a is mounted on the first semiconductor chip 101a via the die bonding sheet 104 as shown in FIG. 3B. At this time, the spacer 113a with a predetermined width is mounted so as to secure a clearance d between the first semiconductor chip 101a and the second semiconductor chip 101b as shown in FIG. 3D. This prevents the wire 112a from being in contact with the die bonding sheet 104a during wire bonding, which is explained later.

(vii) The first semiconductor chip 101a is bonded with a wire 112a as shown in FIG. 3C.

(viii) The second semiconductor chip 101b is mounted on the first semiconductor chip 101a via the spacer 113a and the die bonding sheet 104 as shown in FIG. 3D.

(iv) The second semiconductor chip 101b is bonded with a wire 112b as shown in FIG. 3E.

(x) Afterwards, the semiconductor device 110 is fabricated as shown in FIGS. 3F and 1A by encapusulating with a encapusulating material 111.

However, in the step of picking up each semiconductor chip 101 shown in FIG. 2F, it is not easy to peel the unhardened portion of the die bonding sheet 104 off the hardened portions 104b of the die bonding sheet merged with the sheet 108. In other words, it is difficult to pick up selectively each semiconductor chip 101 adhered to the die bonding sheet 104.

To solve this problem, by a earlier technology, the semiconductor chip 101 is pushed upwards from below the sheet 108 by a needle 114 or the like as shown in FIG. 2G, thereby relaxing and allowing the sheet 108 to be peeled off and then removing the hardened portions 104b of the die bonding sheet.

Also, according to earlier technology, since it is difficult to control the location of the die bonding sheet 104, the die bonding sheet 104 is adhereed across the entire undersides (the first or the third main surfaces) of the semiconductor chips 101. As a result, the die bonding sheet 104 adhered to the underside of the second semiconductor chip 101b protrudes from the spacer 113a, as shown in FIG. 3D. A thick spacer 113a is formed so as to prevent the wire 112a from being in contact with this protruding die bonding sheet 104a. Consequently, the greater the number of wiring layers, the thicker the semiconductor device.

SUMMARY OF THE INVENTION

An aspect of the present invention is characterized by a method of fabrication a semiconductor device including:

mounting a first semiconductor chip on a wiring substrate;

bonding a spacer having a first main surface and a second main surface oppose to the first main surface so that the first main surface contact to the first semiconductor chip; and bonding a second semiconductor chip having a third main surface larger than the first main surface, onto the second main surface via a layer of a die bonding material selectively formed on a part of the third main surface.

Another aspect of the present invention is characterized by a semiconductor device including:

a wiring substrate; a first semiconductor chip mounted on the wiring substrate;

a spacer having a first main surface bonded onto the first semiconductor chip and a second main surface opposing to the main surface;

a die bonding material dipposed on the second main surface; and a second semiconductor chip having a third main surface larger than the first main surface and a fourth main surface opposing the third main surface, and having the center of the third main surface bonded together with the spacer so that the die bonding material is in contact with only a part of the third main surface. The center of the third main surface is bonded together with the spacer so that the die bonding material can be in contact with only a part of the third main surface.

DESCRIPTION OF THE PREFERRED EMBODIMENTS

Figure 1A:
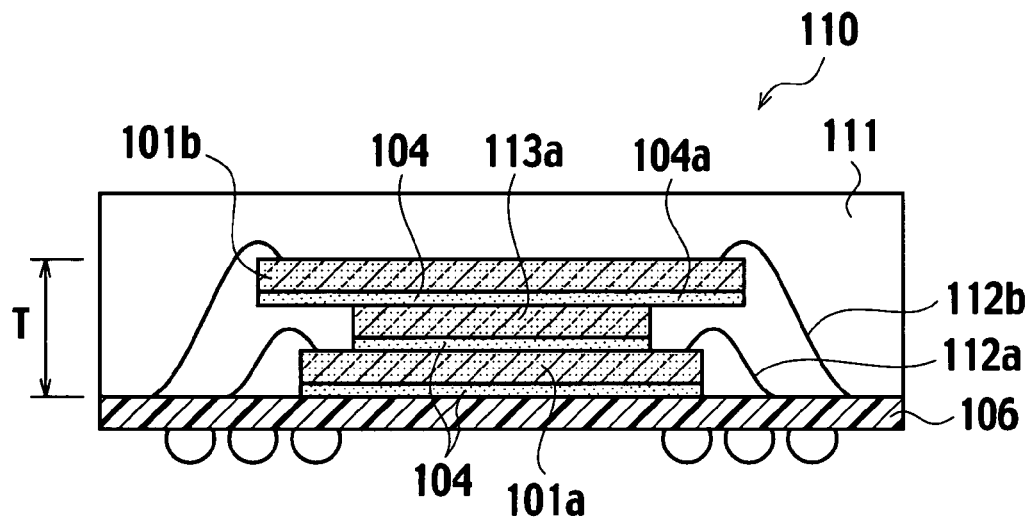
FIGS. 1A and 1B are schematic cross sections of a earlier technology semiconductor device.
Figure 1B:
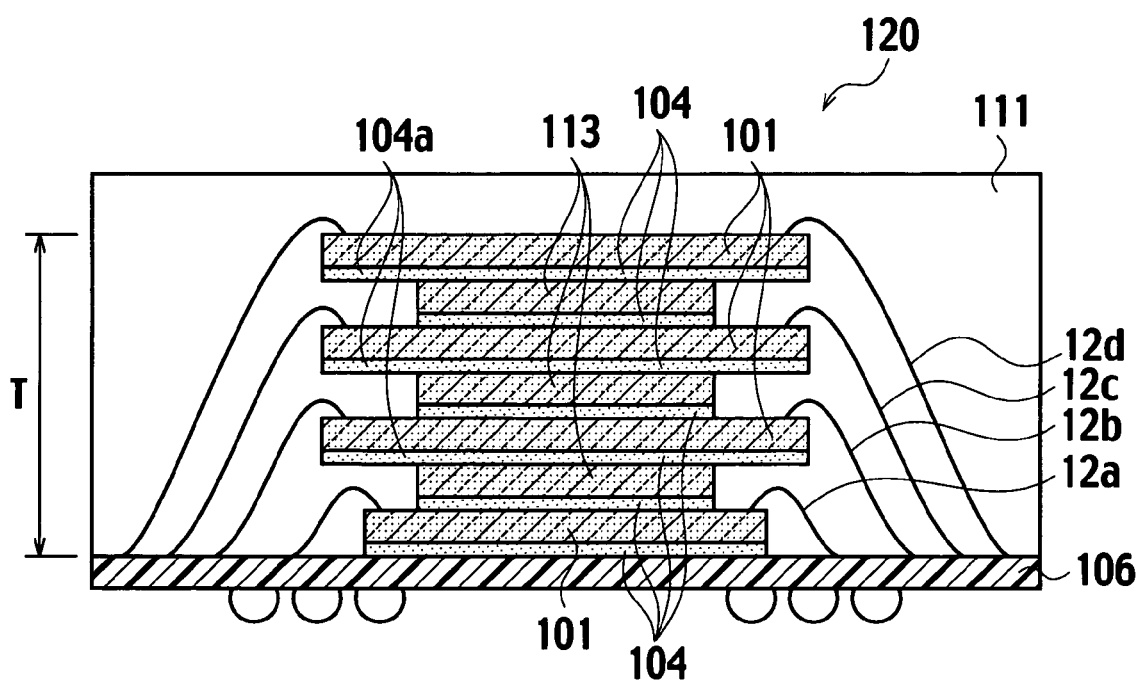
Figure 2A:
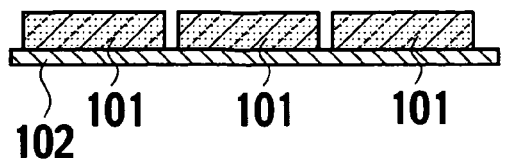
FIGS. 2A to 2G are schematic cross sections showing a earlier technology semiconductor device fabrication method.
Figure 2B:
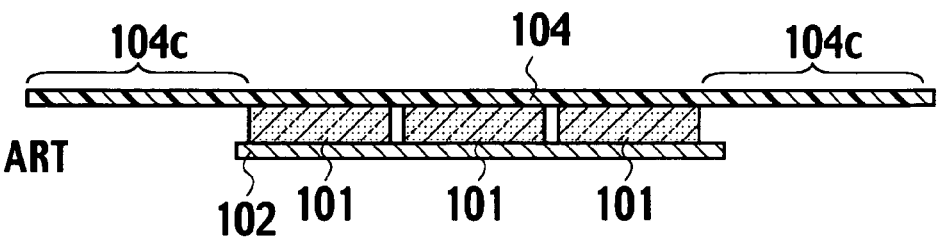
Figure 2C:
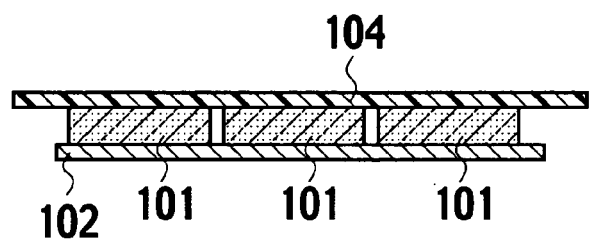
Figure 2D:
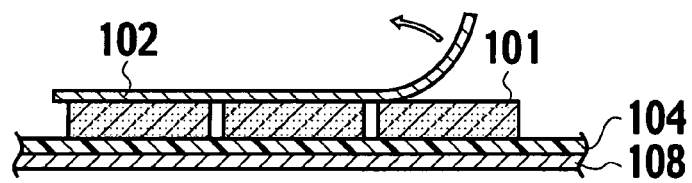
Figure 2E:
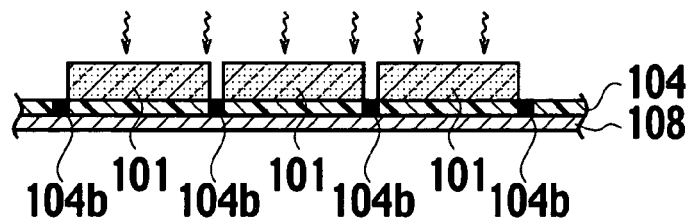
Figure 2F:
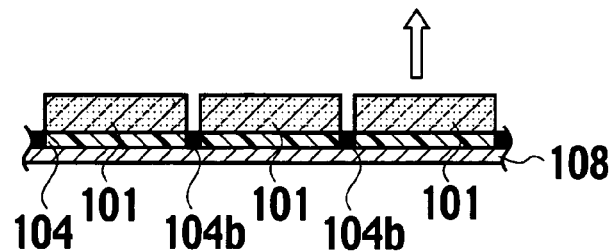
Figure 2G:
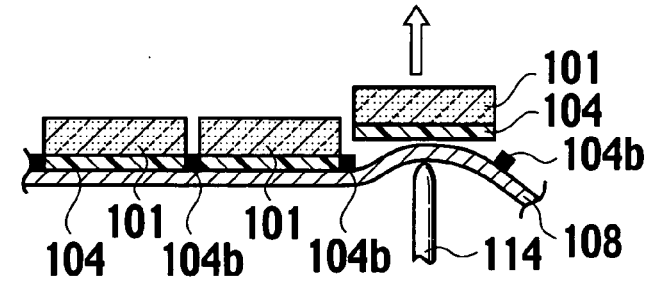

The present invention is explained forthwith according to the following embodiments; however, it is not limited thereto. Note that parts having the same or similar functions in the drawings are assigned the same or similar reference numerals, and descriptions thereof are omitted.

Figure 4A:
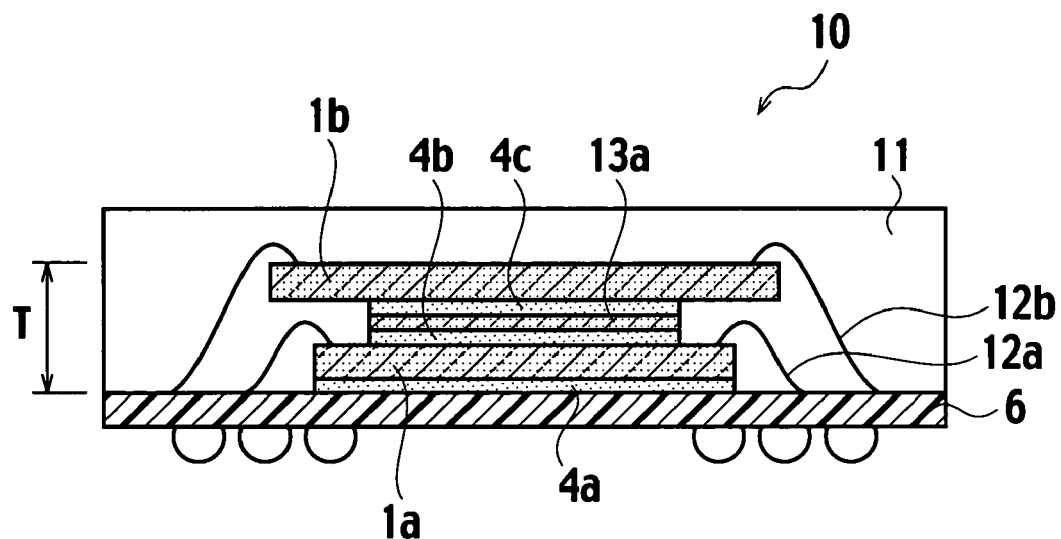
FIGS. 4A and 4B are schematic cross sections of a semiconductor device according to an embodiment of the present invention.

A semiconductor device 10 according to an embodiment of the present invention, as shown in FIG. 4A, includes: a wiring substrate 6; a first semiconductor chip 1a mounted on the wiring substrate 6 via a die bonding material 4a; a spacer 13a having a first main surface bonded to the first semiconductor chip 1a via the die bonding material 4a; a die bonding material 4c bonded to a second main surface opposing the first main surface of the spacer 13a; and a second semiconductor chip 1b, which has a third main surface having a larger area than the first main surface of the spacer 13a and a fourth main surface opposing the third main surface.

Here, the die bonding material 4c is bonded to the center of the third main surface so that the spacer 13a can be in contact with only a part of the third main surface of the second semiconductor chip 1b. In the first and the second semiconductor chips 1a and 1b, semiconductor elements are merged on or in the second and the third main surface opposing the wiring substrate.

The semiconductor device 10 according to the embodiment includes wires 12a and 12b bonded to the respective first and the second semiconductor chips 1a and 1b. It also has the semiconductor chips 1a and 1b mounted via the spacer 13a, and the wires 12a and 12b encapusulated with an encapusulating material 11.

Material for the die bonding material 4 is not limited, and a earlier technology die bonding material having characteristics needed for die bonding may be used as the die bonding material 4. A heat-hardening type or an ultraviolet curing type may be used as the die bonding material 4; more specifically, a certain material having characteristics such as wettability and thixotropy to be suitably used for screen printing may be preferable. Composition and viscosity of the die bonding material 4 are selectable based on the knowledge of those skilled in the art. A die bonding material hardening (or half hardening) method may be selected based on a selected hardening type of the die bonding material 4. Heat-hardening or ultraviolet curing, for example, may be used as the hardening method. Note that either can be used.

A fabrication method for the semiconductor device 10 according to an embodiment is explained forthwith while referencing the DBG methodology process drawings of FIG. 5 and fabrication process drawings of FIGS. 3 and 4.

Figure 5A:
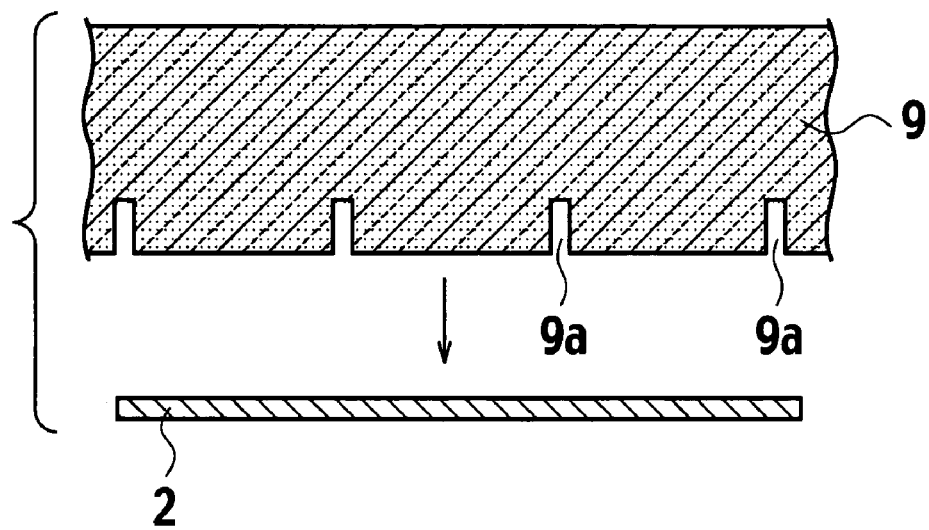
FIGS. 5A to 5C are schematic cross sections showing a fabrication method using the DBG methodology.
Figure 5B:
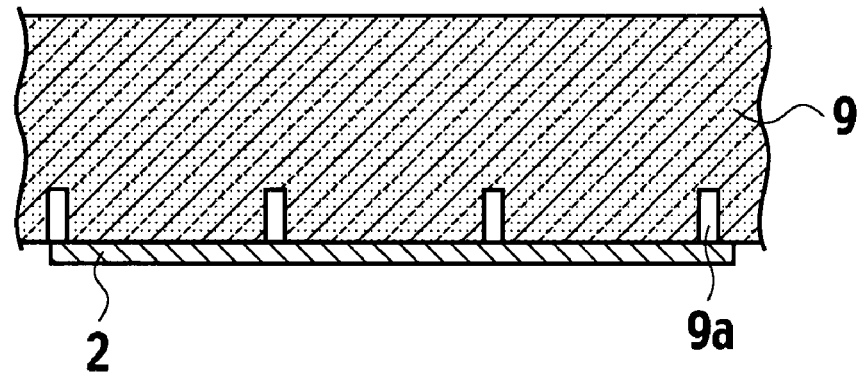

(i) A wafer 9 merging desired semiconductor elements formed on the surface (a fourth main surface) is prepared. Recesses (grooves) 9a, which extend from the fourth main surface of the prepared wafer 9 to a predetermined depth, are formed as shown in FIG. 5A. A surface protection sheet 2 is affixed to the fourth main surface of the wafer 9, as shown in FIG. 5B. Subsequently, the third main surface of the wafer 9 to which the surface protection sheet 2 shown in FIG. 5B is affixed is ground so as to be divided into thinner pieces. Consequently, thin dice-shaped semiconductor chips 1 shown in FIG. 5C, each of which may include minimal wafer cracks and underside chipping due to thinness, are provided through the DBG methodology.

Figure 6A:
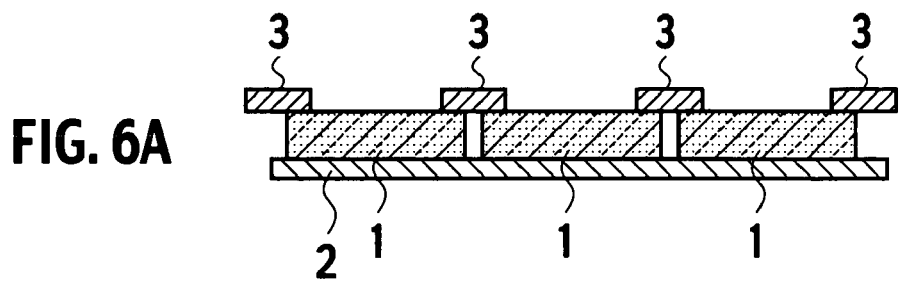
FIGS. 6A to 6E are schematic cross sections showing a semiconductor device fabrication method according to an embodiment of the present invention.
Figure 6B:
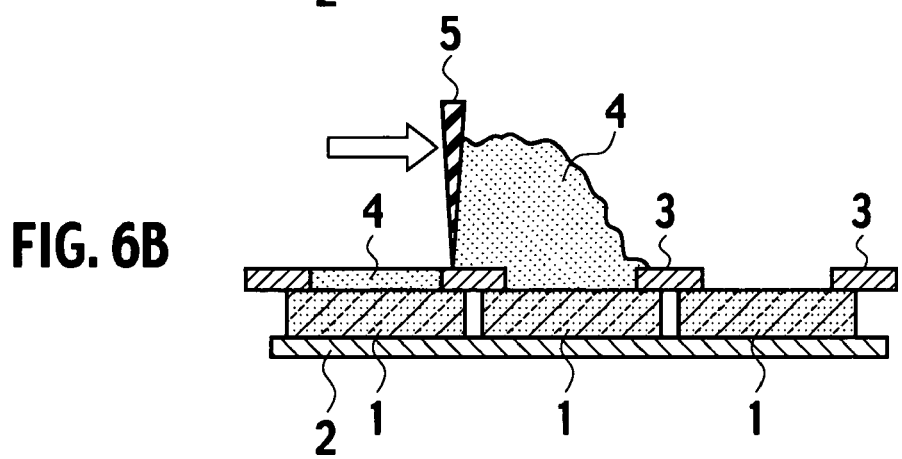
Figure 6C:
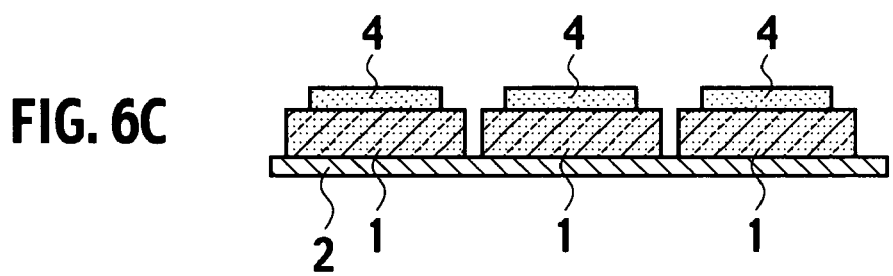

(ii) A screen printing metallic mask 3 is disposed on the third main surfaces of the semiconductor chips 1, as shown in FIG. 6A. Windows are formed in this metallic mask 3 so that the die bonding material 4 can be applied to areas excluding the peripheral regions of the second main surfaces of the semiconductor chips 1. This prevents the die bonding material 4 from protruding from the semiconductor chips 1 in die bonding process. Afterwards, a squeegee 5 is moved in the direction of the arrow, and the die bonding material 4 is applied on the semiconductor chips 1 via the metallic mask 3, as shown in FIG. 6B. Through the above-described steps, almost the same shapes of die bonding material 4 as those of the windows in the metallic mask 3 are delineated on the second main surfaces of the semiconductor chips 1 as shown in FIG. 6C.

(iii) Afterwards, the die bonding material 4 applied to the semiconductor chips 1 is semi-hardened.

Figure 6D:
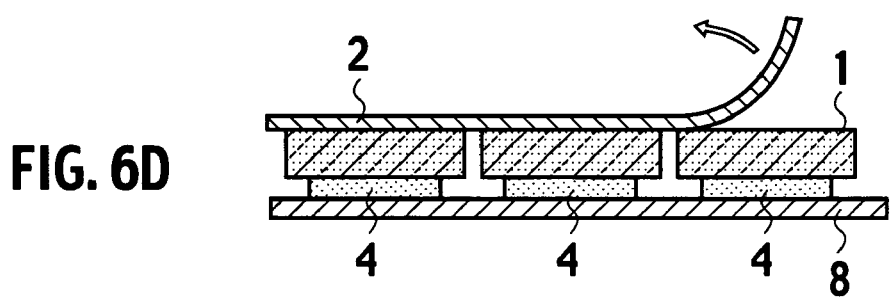

(iv) After turning the semiconductor chip over adhering the semiconductor chip to the sheet 8, the surface protection sheet 2 is peeled off and the adhesion faces of the semiconductor chips 1 are then changed to the sheet 8 as shown in FIG. 6D.

Figure 6E:
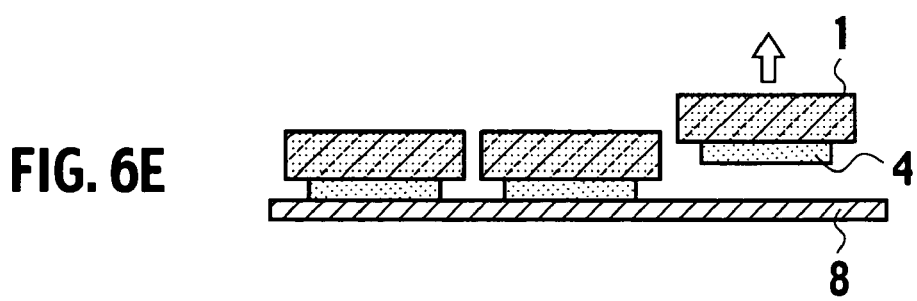

(v) Afterwards, each semiconductor chip 1 adhered to the die bonding material 4 captured using a transfer collet (not shown in the drawings) or the like as shown in FIG. 6E.

(vi) The held semiconductor chip 1 is mounted as the first semiconductor chip 1a on the wiring substrate 6 via the die bonding sheet 4a as shown in FIG. 4A. When the semiconductor chip 1 is mounted, the die bonding sheet 4 is melted and cured by heating or the like.

Figure 7A:
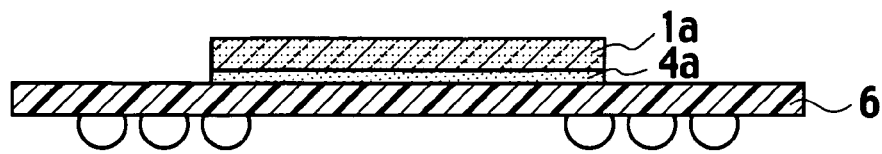
FIGS. 7A to 7F are schematic cross sections showing a semiconductor device fabrication method according to an embodiment of the present invention.
Figure 7B:
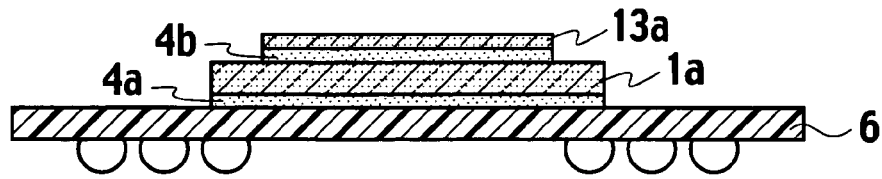

(vii) Subsequently, the die bonding material 4b with the same width as that of the spacer 13a is applied to the first main surface of the spacer 13a through the above-described steps (i) to (vi) according to the embodiment of the present invention. The resulting spacer 13a is mounted on the first semiconductor chip 1a via the die bonding material 4b as shown in FIG. 7B.

Figure 7C:
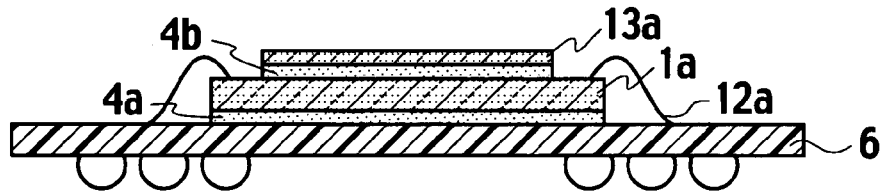

(viii) Afterwards, the first semiconductor chip 1a is bonded with the wire 12a as shown in FIG. 7C.

Figure 7D:
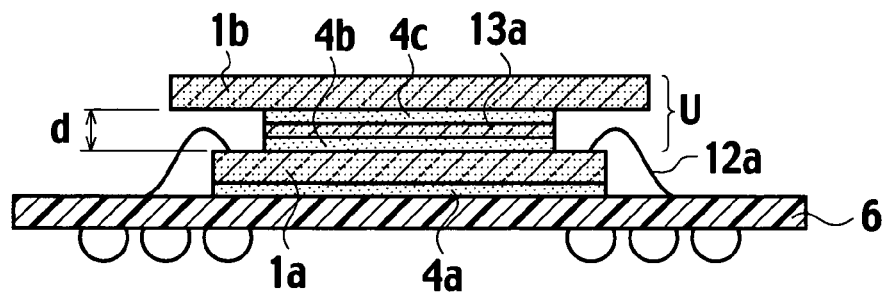

(iv) Subsequently, the die bonding material 4c with the same width as that of the spacer 13a is applied on the first main surface of the second semiconductor chip 1b through the above-described steps (i) to (vi) according to the embodiment of the present invention. The resulting semiconductor chip 1b is mounted on the first semiconductor chip 1a via the spacer 13a and die bonding materials 4b and 4c as shown in FIG. 7D. As a result, a unit U having the spacer 13a and the second semiconductor chip 1b is assembled on the semiconductor chip 1a.

Figure 7E:
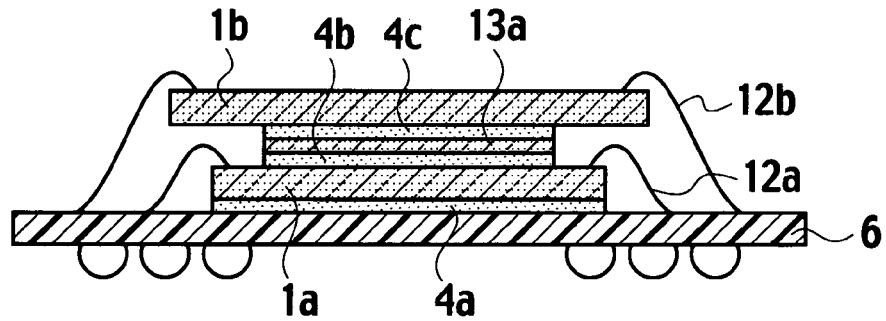

(v) The wire 12b is bonded to the second semiconductor chip 1b as shown in FIG. 7E.

Figure 7F:
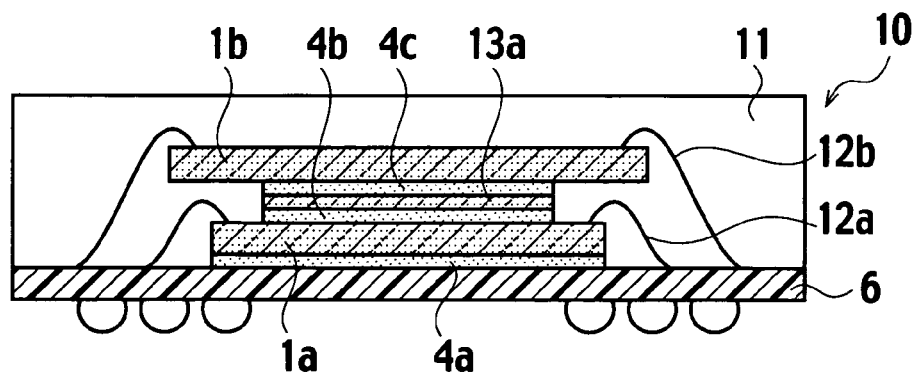

(vi) Afterwards, the semiconductor device 10 is fabricated as shown in FIGS. 7F and 4A by encapusulating with an encapusulating material 111.

An applying position for the die bonding material 4 or a preferable shape of each window formed in the metallic mask 3 is explained forthwith while referencing FIGS. 8A and 8B, FIGS. 9A and 9B and FIGS. 10A and 10B.

Figure 8A:
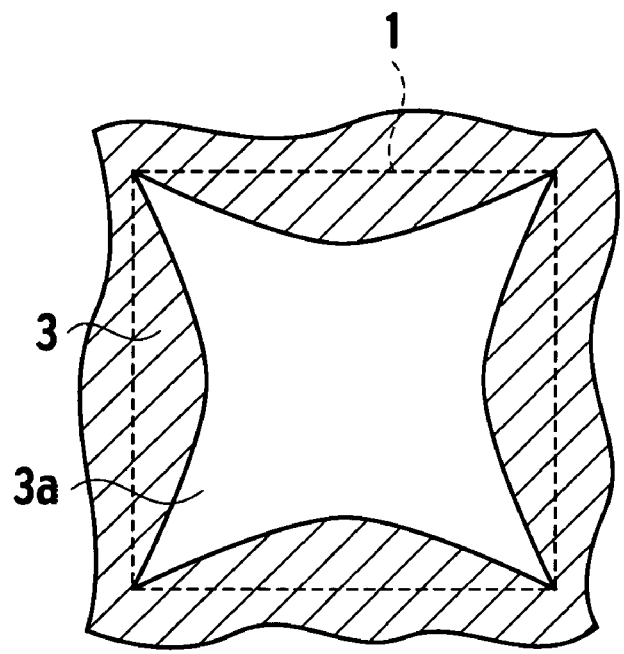
FIGS. 8A and 8B are enlargements of a part of a metallic mask to be used for a semiconductor device fabrication method according to an embodiment of the present invention.

FIG. 8A shows the metallic mask 3 in which a window 3a is formed in a region surrounded by visible curved outlines, each connecting adjacent apexes of a square semiconductor chip 1 indicated by a dashed line. In other words, a bobbin-shaped window 3a is formed having a width narrowing from the center of the semiconductor chip 1 towards each of four corners along approximately diagonal lines of the shape of the semiconductor chip 1.

Figure 8B:
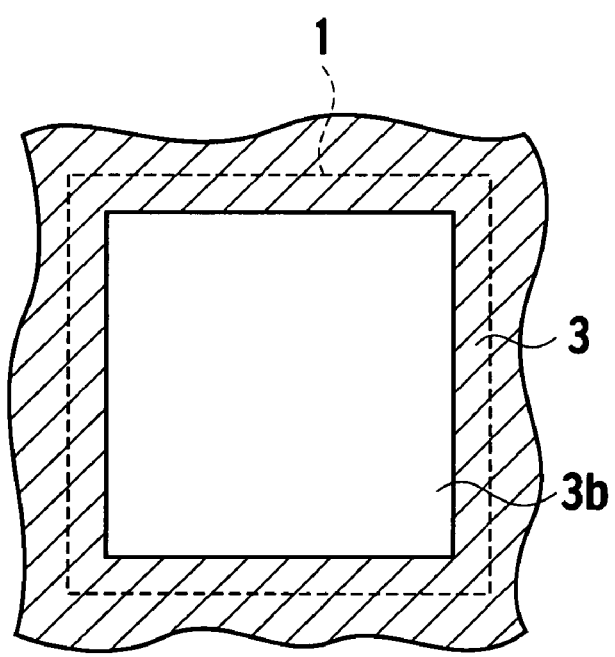
Figure 9A:
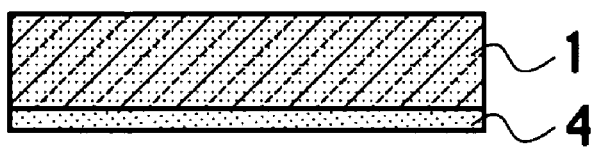
FIGS. 9A, 9B, and 9C show a cross section (before die bonding), the underside (before die bonding), and the underside (after die bonding) of a semiconductor chip with a die bonding material, respectively.
Figure 9B:
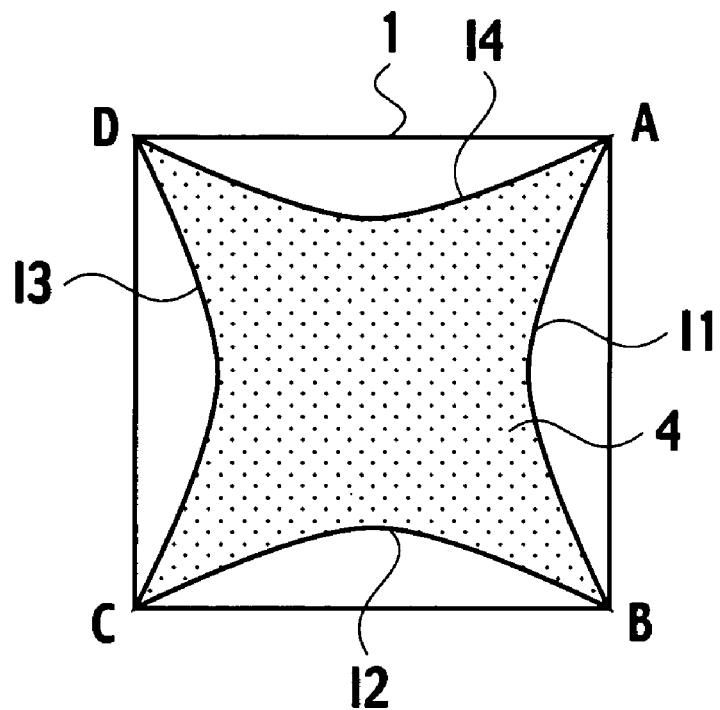
Figure 9C:
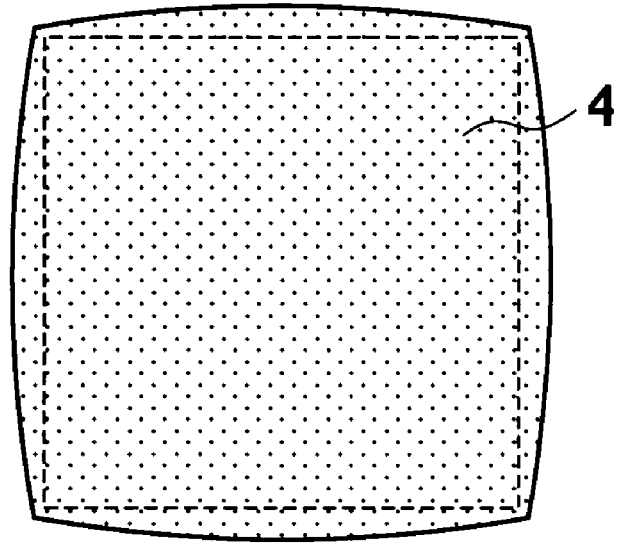
Figure 10A:
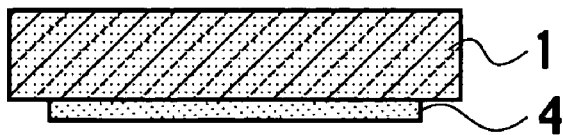
FIGS. 10A, 10B, and 10C show a cross section (before die bonding), the underside (before die bonding), and the underside (after die bonding) of a semiconductor chip with a die bonding material, respectively.
Figure 10B:
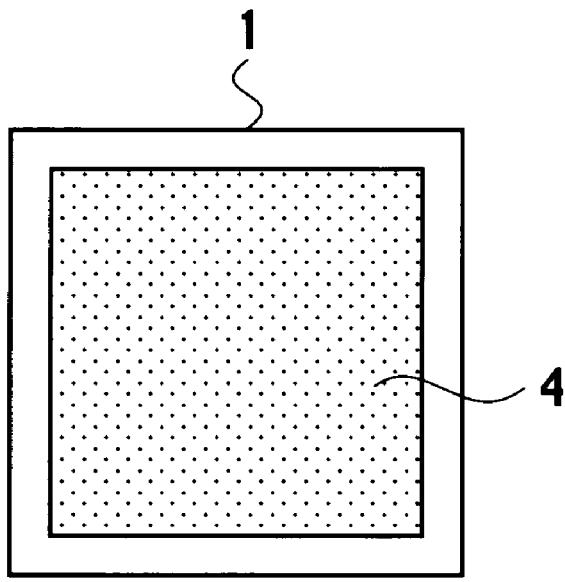
Figure 10C:
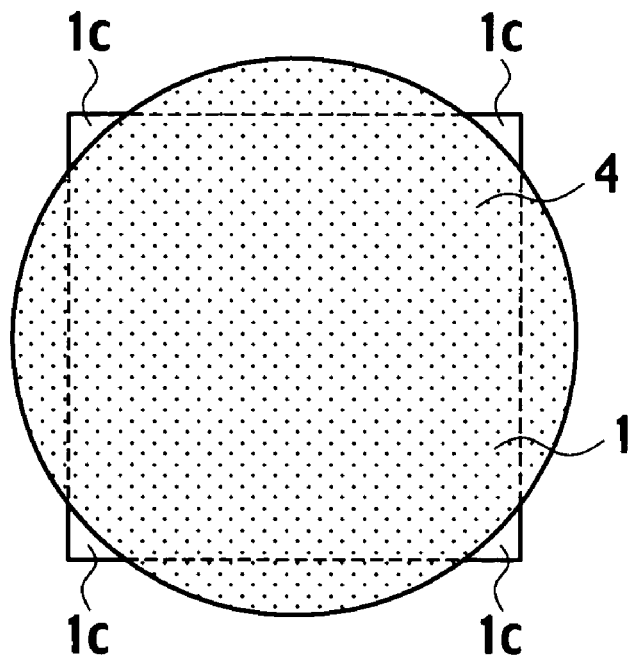

FIG. 8B shows the metallic mask 3 having a quadrilateral window 3b similar to the shape of the semiconductor chip 1 except for the peripheral region thereof. FIGS. 9A, 9B, and 9C show a cross section of the semiconductor chip 1 having the die bonding material 4 (before die bonding), the underside thereof (before die bonding), and underside thereof (after die bonding), respectively, fabricated using the metallic mask 3 shown in FIG. 8A. FIGS. 10A, 10B, and 10C show a cross section of the semiconductor chip 1 having the die bonding material 4 (before die bonding), the underside thereof (before die bonding), and underside thereof (after die bonding), respectively, fabricated using the metallic mask 3 shown in FIG. 8B.

Figure 3A:
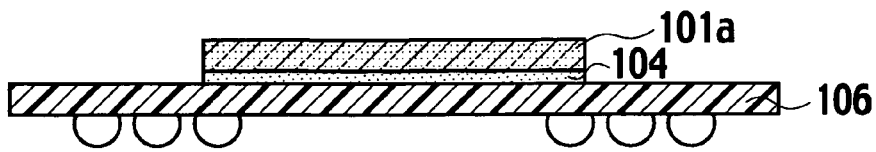
FIGS. 3A to 3F are schematic cross sections showing a earlier technology semiconductor device fabrication method.
Figure 3B:
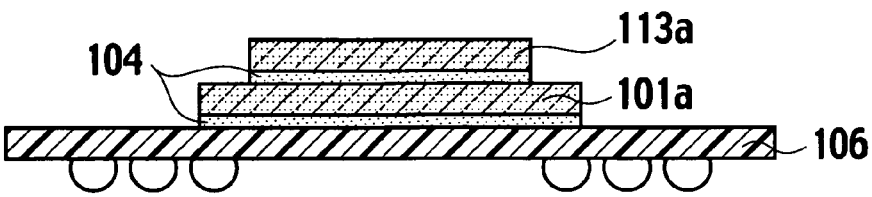
Figure 3C:
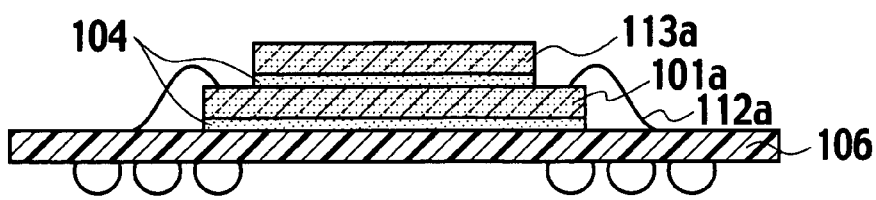

As shown in FIGS. 10A and 10B, the die bonding material 4 is applied on the underside (first main surface) of the semiconductor chip 1 using the metallic mask 3 shown in FIG. 8B. As a result, when die bonding the semiconductor chip 1, the wet die bonding material 4 spreads over the underside of the semiconductor chip 1, as shown in FIG. 3C. The die bonding material 4 also runs out of the portions of the sides indicated by broken lines, which do not include the four corners 1c of the semiconductor chip 1. Such corners 1c where the die bonding material is unapplied may cause a drop in bonding reliability. Moreover, if there are such portions running out of the semiconductor chip, it is necessary to provide a space or clearance for the wiring so as to prevent the material from contaminating the wiring when mounting the semiconductor chip.

On the other hand, by selectively applying the die bonding material 4 on a region defined by curved lines $1_1$, $1_2$, $1_3$, and $1_4$ connecting the apexes A, B, C, and D of the shape of the square semiconductor chip 1 and running the die bonding material into the inner area thereof as shown in FIG. 9B, there are no unapplied regions left when die bonding, and the protrusions of the die bonding material 4 can be minimized.

Since there are no regions, bonding reliability is improved. Moreover, due to the reduced amount of protrusions, the amount of die bonding material 4 to be used is reduced. Furthermore, providing a clearance or space becomes unnecessary for mounting the semiconductor chip or bonding wires. In other words, as compared to the earlier technology semiconductor devices, a thin, mounted semiconductor device can be fabricated.

As described above, it is preferable that the metallic mask 3 to be used for applying the die bonding material 4 has a window formed in a region defined by the curve lines $1_1$, $1_2$, $1_3$, and $1_4$ connecting adjacent ones of the apexes A, B, C, and D of the polygon as shown in FIG. 8A.

According to the embodiment of the present invention described above, the step of removing protrusions of the die bonding sheet (material) can be omitted. Moreover, since the positions of applying the die bonding material can be controlled, the amount of the die bonding material running out of a semiconductor chip which occurs when mounting the chip is considerably reduced. Consequently, a simplified fabrication process can be provided, and the amount of die bonding material to be used is reduced. Furthermore, a minimal clearance required in the wire bonding step can be attained.

Figure 3D:
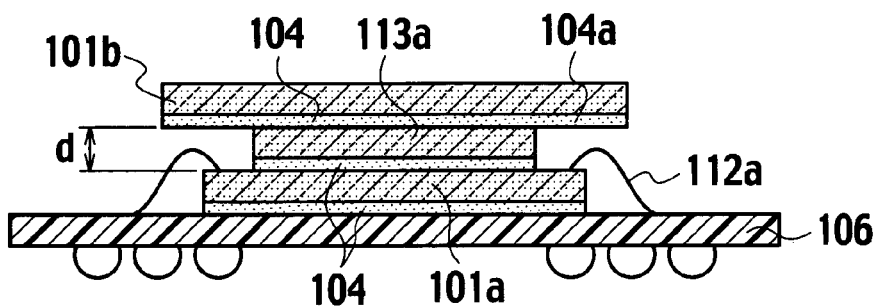
Figure 3E:
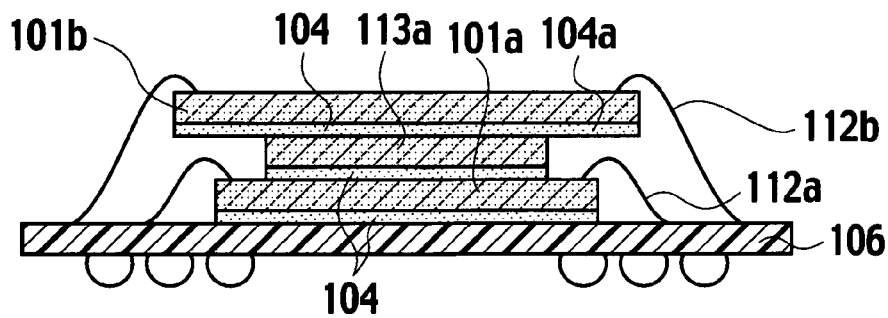
Figure 3F:
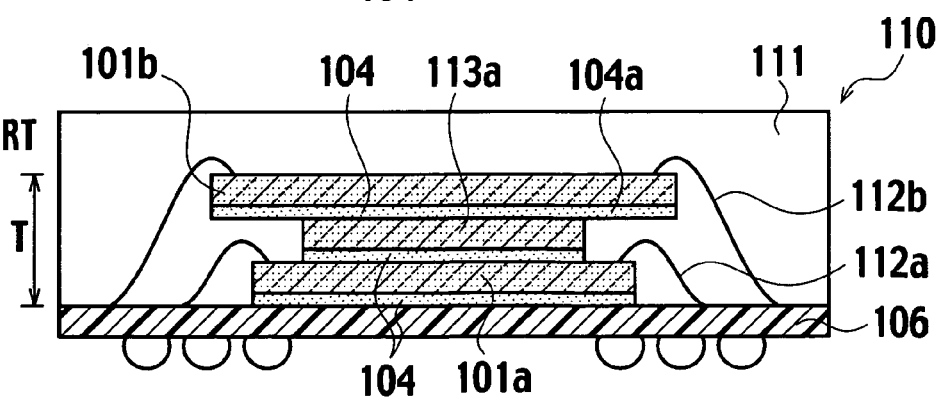

Moreover, according to the embodiment of the present invention, thinner semiconductor devices than the earlier technology devices can be provided. In other words, in a earlier technology method, a die bonding sheet (material) 104a is adhered to the third main surface of the second semiconductor chip 101b as shown in FIG. 3D. Therefore, the die bonding material 104a hangs out of the spacer 113a. On the other hand, according to the embodiment of the present invention as shown in FIG. 7D, die bonding materials 4a and 4b are formed on only portions in contact with the second semiconductor chip 1b and the spacer 13a, respectively. In other words, a clearance between semiconductor chips can be provided without using a thick spacer 13a. According to the embodiment of the present invention described above, a thin spacer 13a can be formed, thereby providing a thin semiconductor device.

Figure 4B:
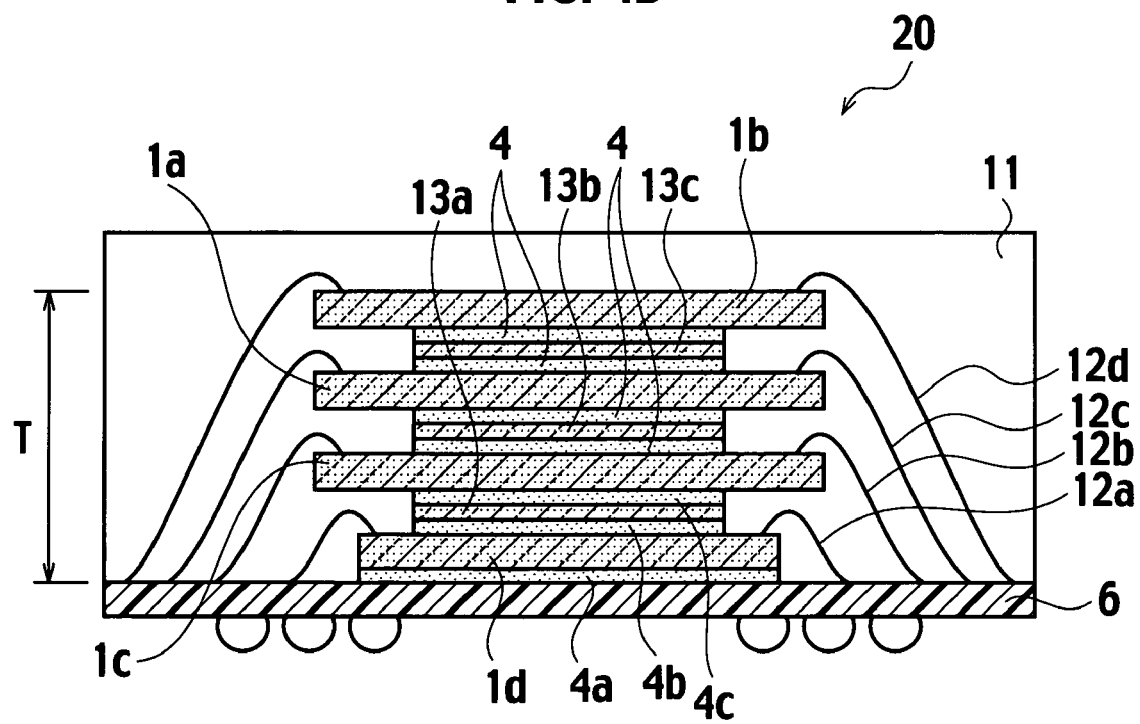
Figure 5C:
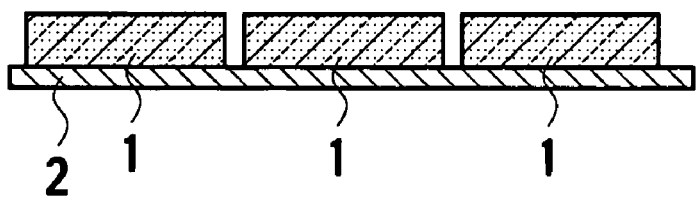

As shown in FIG. 4B, additional semiconductor chips 1c and 1d may be mounted between the first semiconductor chip 1a and the wiring substrate 6.

A semiconductor device including two semiconductor chips is explained according to the above-described embodiment. As shown in FIG. 4B, however, a semiconductor device 20 including four semiconductor chips can be also fabricated by mounting additional semiconductor chips 1 via spacers 13 using the aforementioned fabrication method according to the embodiment. In this manner, fabrication of multilayers by increasing the number of units, each being made from a semiconductor chip and a spacer, results in a thin semiconductor device.

An applying position for the die bonding material 4 or another preferable shape of each window formed in the metallic mask 3 is explained by referencing to FIGS. 11A and 11B, FIGS. 12A to 12C, 13A to 13C, and FIGS. 14A and 14B.

Figure 11A:
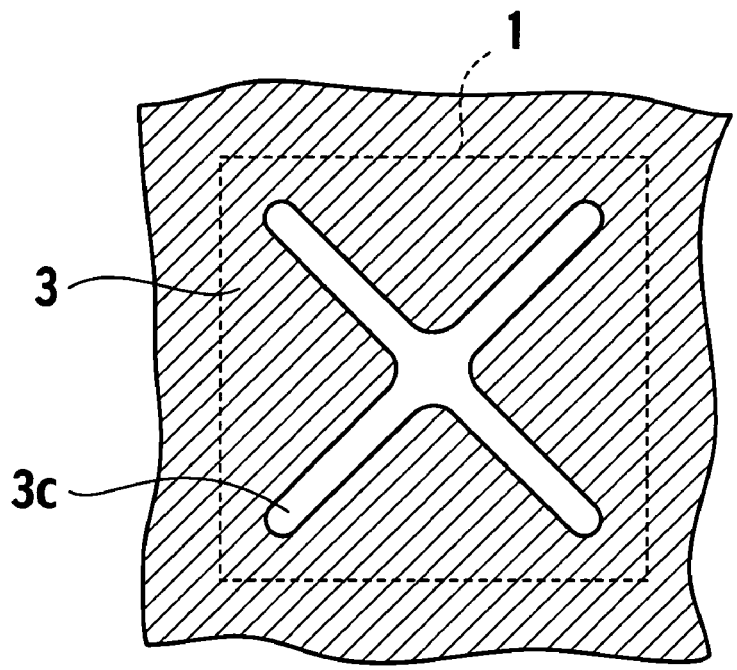
FIGS. 11A and 11B are enlargements of a part of a metallic mask to be used for a semiconductor device fabrication method according to a modification of an embodiment of the present invention.
Figure 11B:
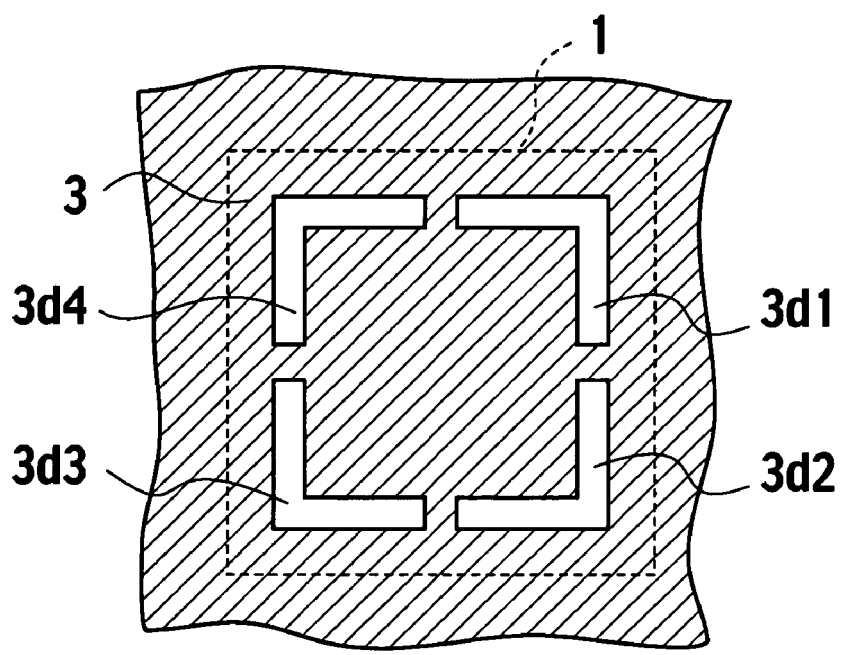
Figure 12A:
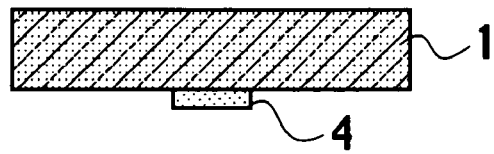
FIGS. 12A, 12B, and 12C show a cross section (before die bonding), the underside (before die bonding), and the underside (after die bonding) of a semiconductor chip with a die bonding material, respectively.
Figure 12B:
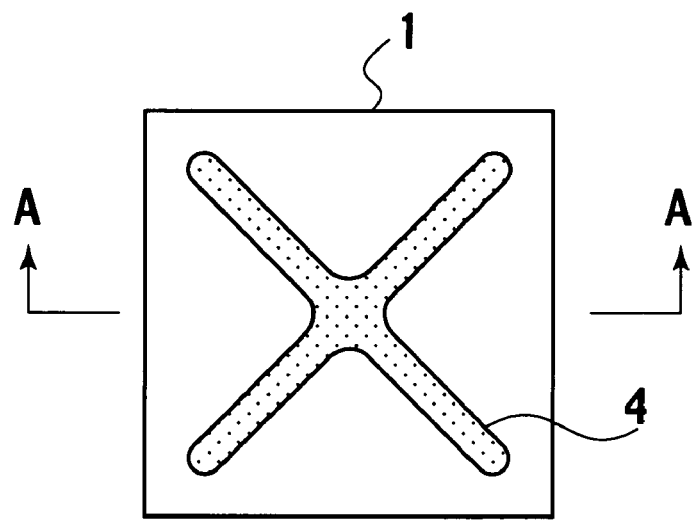
Figure 12C:
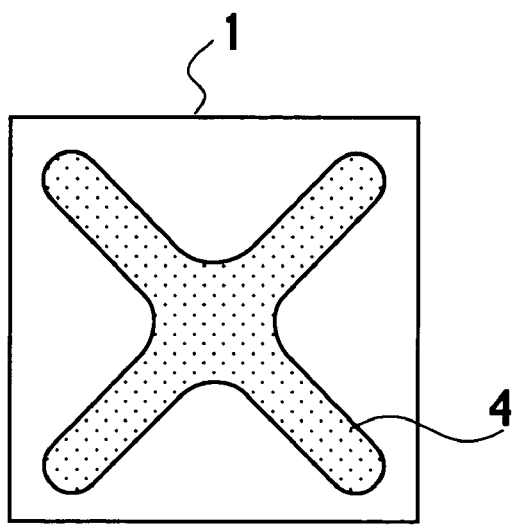
Figure 13A:
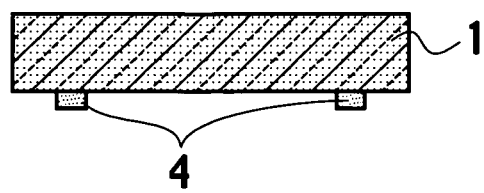
FIGS. 13A, 13B, and 13C show a cross section (before die bonding), the underside (before die bonding), and the underside (after die bonding) of a semiconductor chip with a die bonding material, respectively.
Figure 13B:
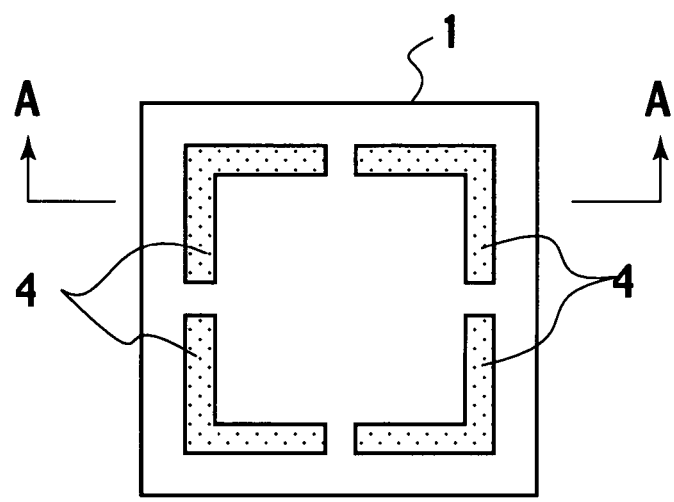
Figure 13C:
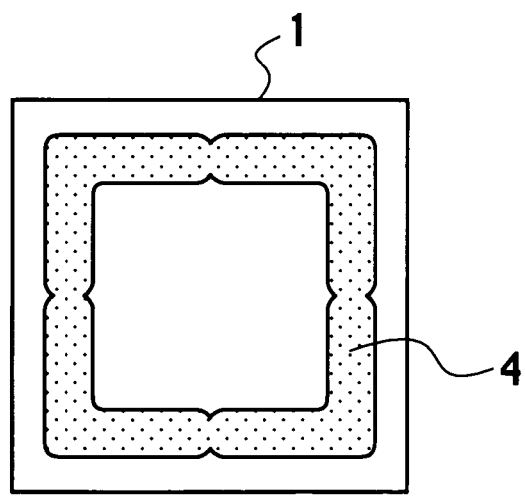

FIG. 11A shows the metallic mask 3 in which a window 3c is formed in a shape similar to an X shape on the approximately diagonal lines of the shape of the semiconductor chip 1. FIG. 11B shows the metallic mask 3 having windows 3d1 to 3d4 formed to pass through the center of semiconductor chip 1 and an end of the semiconductor chip 1. In other words, L shaped windows 3d1 to 3d4 are formed on the corners of the semiconductor chip 1. FIGS. 12A to 12C show a cross section of the semiconductor chip 1 having the die bonding material 4 (before die bonding), the underside thereof (before die bonding), and the underside thereof (after die bonding), respectively, fabricated using the metallic mask 3 shown in FIG. 11A. FIGS. 13A to 13C show a cross section of the semiconductor chip 1 having the die bonding material 4 (before die bonding), the underside thereof (before die bonding), and an underside thereof (after die bonding), respectively, fabricated using the metallic mask 3 shown in FIG. 11B.

Figure 14A:
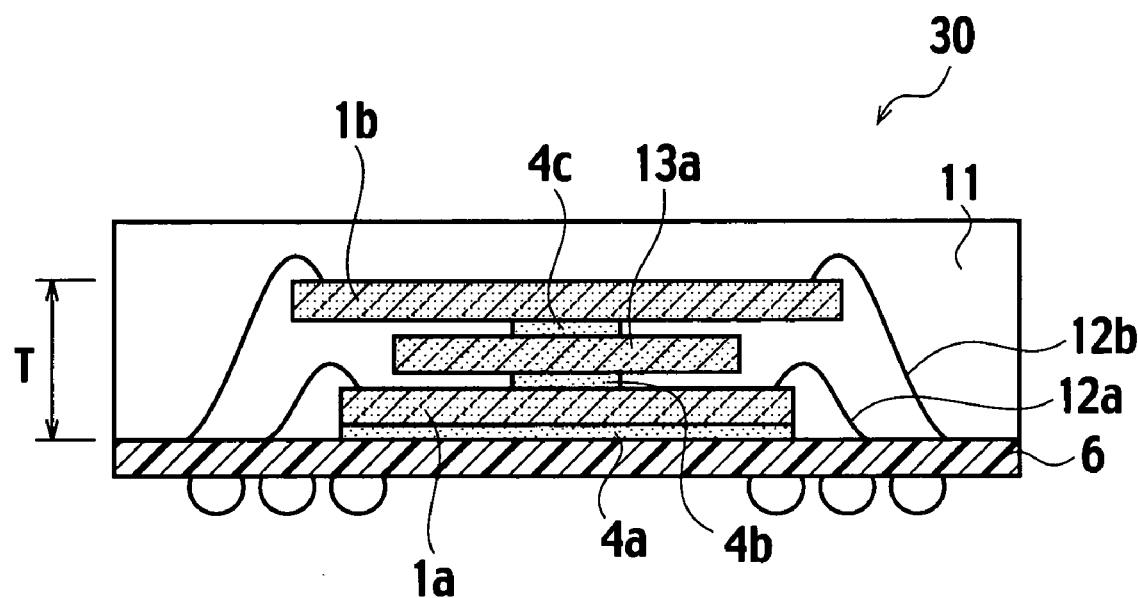
FIGS. 14A and 14B are schematic cross sections of a semiconductor device according to a modification of an embodiment of the present invention.

As shown in FIGS. 12A and 12B, the die bonding material 4 is applied on the underside (first main surface) of the semiconductor chip 1 using the metallic mask 3 shown in FIG. 11A. As a result, when die bonding the semiconductor chip 1, the wet die bonding material 4 spreads over the underside of the semiconductor chip 1, on the approximately diagonal lines of the shape of the semiconductor chip 1, as shown in FIG. 12C. Upon the encapusulation, encapusulating material 11 is encapusulated between semiconductor chip 1a, except for die bonding material 4, so as to provide a semiconductor device 30 as shown in FIG. 14A.

Figure 14B:
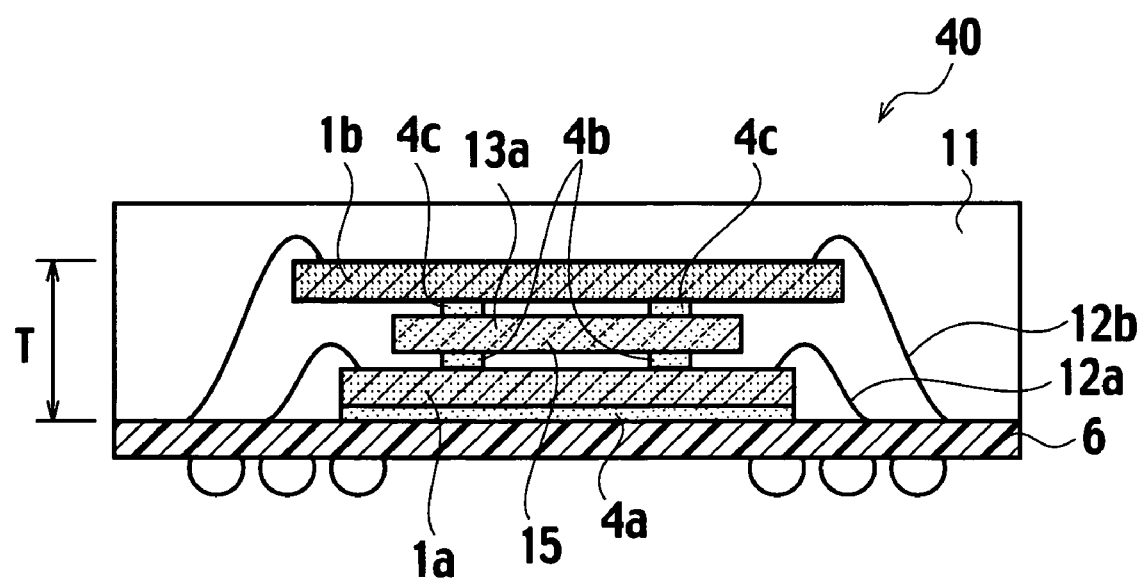

As shown in FIGS. 13A and 13B, the die bonding material 4 is applied on the underside (first main surface) of the semiconductor chip 1 using the metallic mask 3 shown in FIG. 11B. As a result, when die bonding the semiconductor chip 1, the wet die bonding material 4 spreads over the underside of the semiconductor chip 1, to pass through the center of semiconductor chip 1 and an end of the semiconductor chip 1, as shown in FIG. 13C. Upon encapusulation, encapusulating material 11 is encapusulated between semiconductor chip 1a, 1b, so as to provide a semiconductor device 30 as shown in FIG. 14B.

By selectively applying the die bonding material 4 on under side of semiconductor chip 1, the amount of die bonding material 4 is significantly reduced compared with applying the die bonding material 4 on the entire surface of the underside of semiconductor chip 1.

Note that while the shape of the window formed in the metallic mask 3 has been explained in the description of the aforementioned embodiment, a screen printing metallic mask with the same shape to be used for fabricating a semiconductor device is provided according to another embodiment. The thickness and material of the metallic mask are selectable based on knowledge of those skilled in the art.

FIRST EXAMPLE

A semiconductor device 10 shown in FIG. 4A is fabricated under the following conditions in conformity with the above-described embodiment.

A metallic mask 3 including equally-spaced bobbin-shaped windows is used as a metallic mask as shown in FIG. 8A. It is assumed that the thickness of the metallic mask 3 is 20 μm and the material is stainless steel. An ultraviolet curing die bonding material is used as the die bonding materials 4a and 4b. It is assumed that a 8×8 mm dice-shaped semiconductor chip 1 with a thickness of 85 μm is used as the semiconductor chips 1a and 1b, and that a 6×6 mm spacer 13 with a thickness of 70 μm is used as the spacer 13a. Moreover, it is assumed that the thickness of the die bonding materials 4a and 4b to be applied to the semiconductor chips 1a and 1b and spacer 13a is approximately 15 μm.

The semiconductor chip 1a with the die bonding material 4a is mounted on the wiring substrate 6. The wire 12a is bonded to the semiconductor chip 1a. Afterwards, the second semiconductor chip 1b is mounted via the spacer 13. The die bonding material 4b having the same width as that of the spacer 13a is formed on both sides of the spacer 13a. The semiconductor chip 1b is bonded with the wire 12b and encapsulated with a encapusulating material 11, resulting in a stacked MCM semiconductor chip 10 having two semiconductor chips 1a and 1b, as shown in FIG. 4A. Note that T (which denotes the thickness of the semiconductor device or the distance from the top of the wiring substrate 6 to the top of the very last wiring layer, and is used in the second embodiment and comparative examples 1 and 2) is 285 μm.

SECOND EXAMPLE

Except for the number of semiconductor chips being increased from two to four, a stacked MCP semiconductor device 20 is fabricated in the same manner as with the first embodiment, as shown in FIG. 4B. The thickness T of the semiconductor device is 655 μm.

COMPARATIVE EXAMPLE 1

The semiconductor device 110 shown in FIG. 8A is fabricated in the same manner as with the first embodiment except for the die bonding material 104 being prepared on the semiconductor chip 101 using a earlier technology method instead of applying a die bonding material on a semiconductor chip via a metallic mask of the present invention.

A 85 μm thick 6×6 mm spacer is used as the spacer 113. The thickness T of the semiconductor device is 300 μm.

COMPARATIVE EXAMPLE 2

The semiconductor device 120 shown in FIG. 8A is fabricated in the same manner as with the first embodiment except for the die bonding material 104 being prepared on the semiconductor chip 101 using a earlier technology method instead of applying a die bonding material on a semiconductor chip via a metallic mask of the present invention. A 6×6 mm spacer with 85 μm in thickness is used as the spacer 113. The thickness T of the semiconductor device is 700 μm.

Test results from the first and the second embodiment and the comparative examples 1 and 2 provide the following findings.

According to comparative example 1, a thick spacer 113a is needed so as to provide enough clearance between the wire 112a and the die bonding material 104a on the semiconductor chip 101b as shown in FIG. 8A. On the other hand, since the first embodiment improves the aforementioned problem with wiring clearance, the thickness of the spacer 13a can be reduced. Consequently, according to the first embodiment, an approximately 15 μm-thick space per single wiring layer corresponding to the thickness of the die bonding material 4 can be omitted. In this manner, the first embodiment improves the wiring clearance, which allows fabrication of a thinner semiconductor device than that of comparative example 1 while maintaining the same number of wiring layers.

According to a comparision of thickness T in comparative example 2 and the second embodiment, the second embodiment can provide a reduced thickness compared to that of comparative example 2 by approximately 45 μm. This means that the greater the number of wiring layers, the thinner the thickness of the semiconductor device.

What is claimed is:

1. A method of fabricating a semiconductor device, comprising:

mounting a first semiconductor chip on a wiring substrate;

bonding a spacer having a first main surface and a second main surface opposing the first main surface so that the first main surface contacts the first semiconductor chip;

bonding a second semiconductor chip having a third main surface larger than the first main surface, onto the second main surface via a layer of a die bonding material selectively formed on a part of the third main surface to cover at least those portions of the third main surface which are in contact with the second main surface, wherein:

the layer of the die bonding material is formed on a part of the third main surface by screen printing, and the second semiconductor chip is bonded thereto; and the layer of the die bonding material is selectively applied on a region of the third main surface defined by curved lines connecting adjacent apexes of a polygon, wherein the center of each curved line runs into an inner area of lines connecting adjacent apexes, which correspond to a beginning and the end point of each curved line;

integrating semiconductor elements in a first surface of a wafer;

forming recesses in the first wafer surface;

bonding a surface protection sheet onto the first wafer surface;

grinding a second wafer surface opposing the first wafer surface so as to cut off the second semiconductor chip from the wafer.

2. The method of claim 1, wherein the semiconductor device comprises a wire bonding.

* * * * *